(12) United States Patent
Li et al.

(10) Patent No.: US 10,892,405 B2
(45) Date of Patent: Jan. 12, 2021

(54) HALL-EFFECT SENSOR PACKAGE WITH ADDED CURRENT PATH

(71) Applicant: Texas Instruments Incorporated, Dallas, TX (US)

(72) Inventors: Ming Li, Plano, TX (US); Yiqi Tang, Allen, TX (US); Jie Chen, Dallas, TX (US); Enis Tuncer, Dallas, TX (US); Usman Mahmood Chaudhry, McKinney, TX (US); Tony Ray Larson, Tucson, AZ (US); Rajen Manicon Murugan, Dallas, TX (US); John Paul Tellkamp, Rockwall, TX (US); Satyendra Singh Chauhan, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/404,978

(22) Filed: May 7, 2019

(65) Prior Publication Data

US 2020/0357987 A1 Nov. 12, 2020

(51) Int. Cl.
| | | |
|---|---|---|
| *H01L 43/04* | (2006.01) | |
| *H01L 43/06* | (2006.01) | |
| *H01L 43/14* | (2006.01) | |
| *G01R 15/20* | (2006.01) | |
| *H01L 23/495* | (2006.01) | |
| *G01R 33/07* | (2006.01) | |
| *G01R 33/00* | (2006.01) | |

(52) U.S. Cl.
CPC ............ *H01L 43/14* (2013.01); *G01R 15/202* (2013.01); *G01R 33/07* (2013.01); *H01L 23/49548* (2013.01); *H01L 43/065* (2013.01); *G01R 33/0052* (2013.01)

(58) Field of Classification Search
None
See application file for complete search history.

(56) References Cited

U.S. PATENT DOCUMENTS

| | | | |
|---|---|---|---|
| 6,545,456 | B1 | 4/2003 | Radosevich et al. |
| 6,611,137 | B2 | 8/2003 | Haensgen et al. |
| 9,190,606 | B2 | 11/2015 | Liu et al. |
| 9,389,295 | B2 | 7/2016 | Fisher |

(Continued)

FOREIGN PATENT DOCUMENTS

CN 105607018 5/2016

*Primary Examiner* — Daniel Whalen
(74) *Attorney, Agent, or Firm* — Ronald O. Neerings; Charles A. Brill; Frank D. Cimino

(57) ABSTRACT

A Hall-effect sensor package includes and an IC die including a Hall-Effect element and a leadframe including leads on a first side providing a first field generating current (FGC) path including ≥1 first FGC input pin coupled by a reduced width first curved head over or under the Hall-effect sensor element to ≥1 first FGC output pin, and second leads on a second side of the package. Some leads on the second side are attached to bond pads on the IC die including the output of the Hall-effect element. A clip is attached at one end to the first FGC input pin and at another end to a location on the first FGC output pin, having a reduced width second curved head in between that is over or under the Hall-effect sensor element opposite the first head.

21 Claims, 12 Drawing Sheets

(56) References Cited

U.S. PATENT DOCUMENTS

2006/0181263 A1* 8/2006 Doogue ................ G01R 33/07
324/117 H
2014/0264678 A1* 9/2014 Liu ..................... H01L 21/4828
257/427
2017/0222131 A1* 8/2017 Chew ...................... H01L 43/04

* cited by examiner

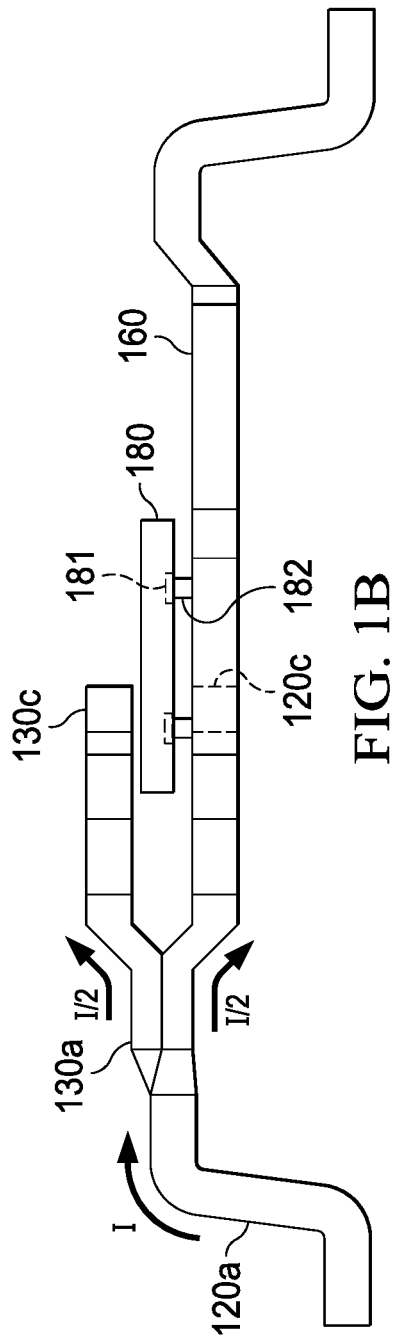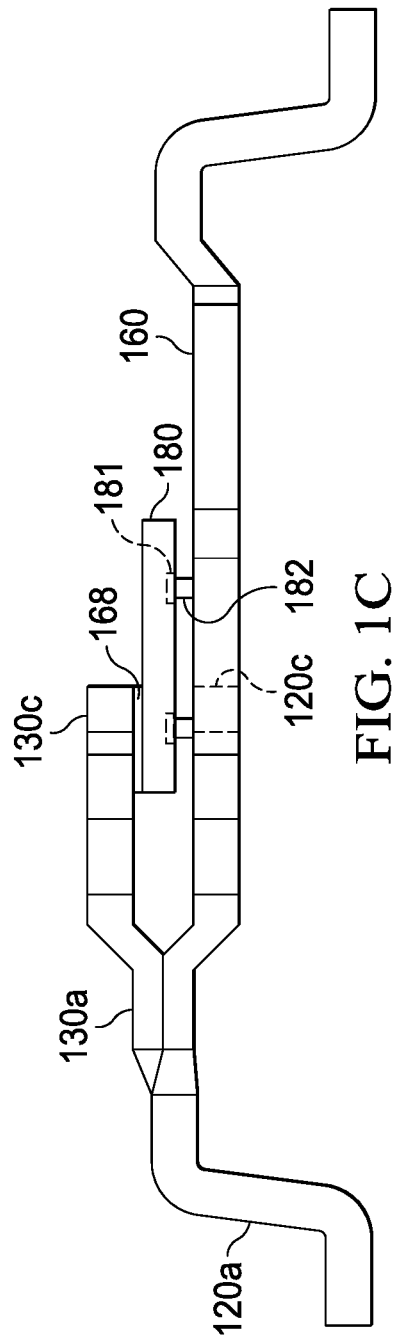

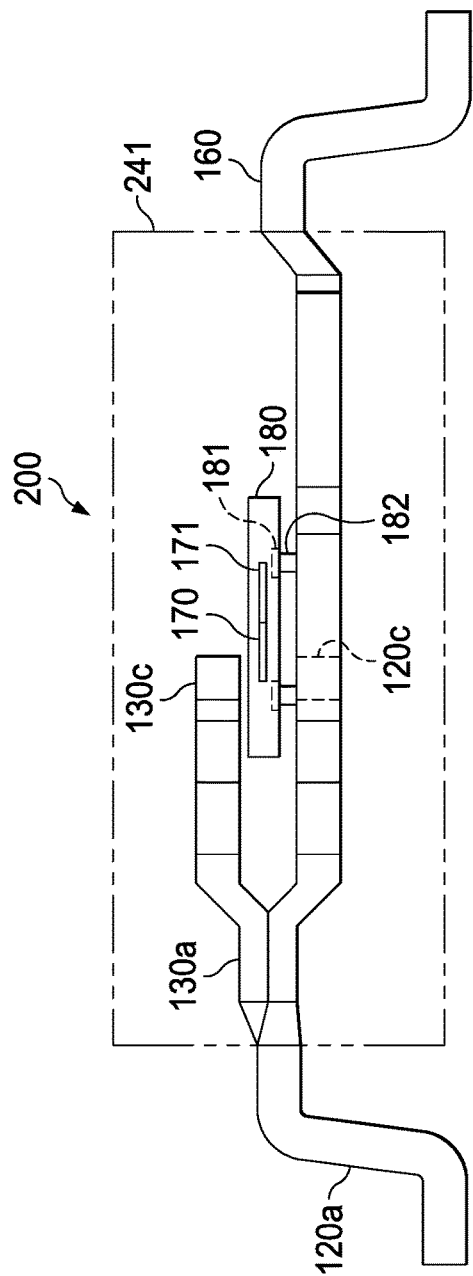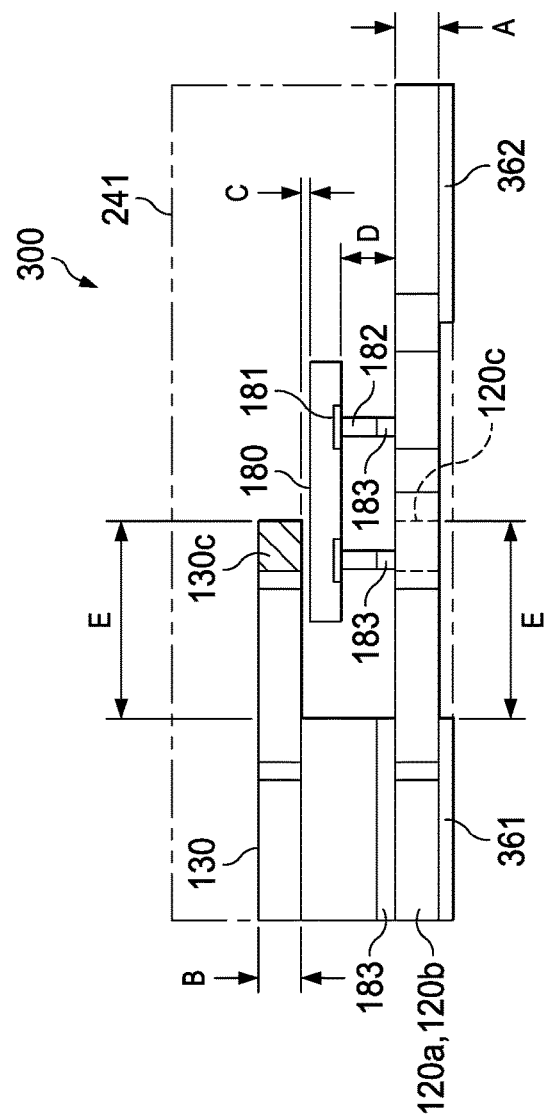

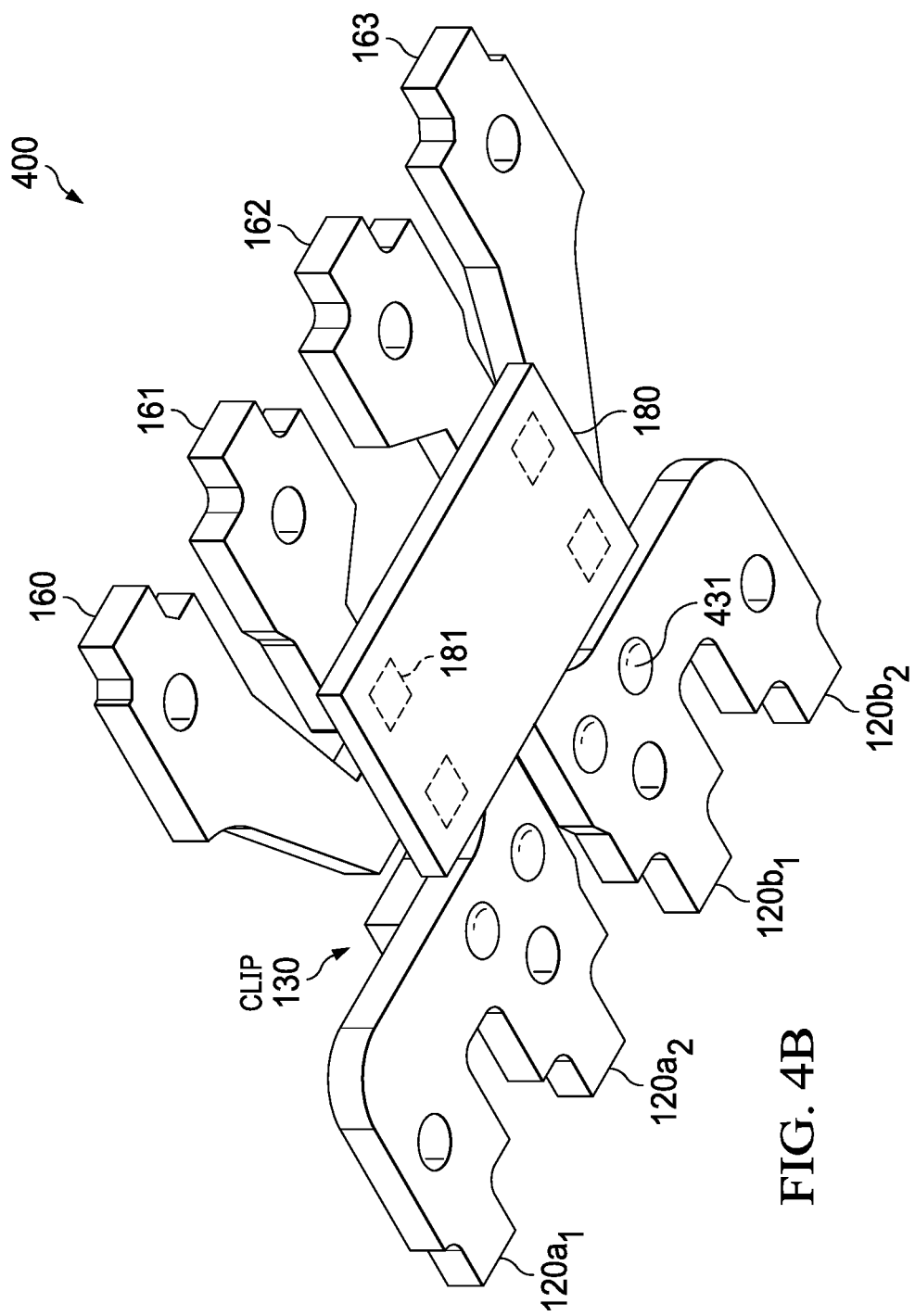

| FOM PERFORMANCE COMPARISON | | |
|---|---|---|
| FOM | ORIGINAL Pkg | DISCLOSED Pkg |
| DC RESISTANCE (mOhm) | 1.727 | 0.621 ~65% DC R REDUCTION |
| JOULE HEATING (°C) *JEDEC 4ML 2s2p PCB 25 DEGREE C AMBIENT, 40A CURRENT | LF/DIE 584.6/419.9 | LF/DIE 117.8/100.0 ~79% THERMAL REDUCTION |
| MAGNETIC FIELD STRENGTH (mT) | ~24mT @20A | ~32mT @40A ~40mT @50A ~33-45% @40A 60% @50A+ |
| STRESSED VOLUME [x1e-9] m^3 *4kV APPLY BETWEEN PINS TEST VOLTAGE FOR 600V APPLICATIONS | 0.3707 | 0.4462 ~20% INCREASE |

HALL-EFFECT SENSOR PACKAGE WITH ADDED CURRENT PATH

FIELD

This Disclosure relates to Hall-effect sensors.

BACKGROUND

The Hall-effect is known to be the generation of a potential difference (voltage) across an electrical conductor typically being a semiconductor material, known as a Hall voltage, when a magnetic field is applied in a direction perpendicular to the flow of current in the electrical conductor, typically flowing in a doped semiconductor. A Hall-effect sensor is a transducer that varies its output voltage in response to a magnetic field created by a current to be measured by the sensor, where the current to be measured can be an alternating current (AC) or a direct-current (DC). Hall-effect sensors can be configured in either open-loop or closed-loop sensor configurations.

A Hall-effect sensor generally comprises an integrated circuit (IC) die having a semiconductor Hall-effect sensor element to detect a magnetic field produced by the current to be measured, and a signal processing chain coupled to an output of the Hall sensor element including an amplifier (e.g., a chopped low noise amplifier) to amplify the generally low level output voltage sensed, that are all generally provided in a molded package. The molded package may comprise an 8 pin small outline integrated circuit (SOIC). The signal processing chain can also include spinning switches and integrators.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes for conventional Hall-effect sensor packages there are several limitations. These limitations include only supporting about 15 A to 20 A of maximum field generating current (FGC), thus limiting the possible magnetic field strength and causing excessive Joule heating (JH) due to a leadframe thermal dissipation issue, as well as a low sensitivity which depends on the magnetic field strength ($\mu V$ resolution). Other shortcomings include a relatively high DC resistance, and a high voltage induced dielectric breakdown problem due to the breakdown of the mold compound or the breakdown of passivation dielectric layer(s) on the top surface of the Hall-effect IC die.

Disclosed aspects include Hall-effect sensor packages that include at least one additional FGC path(s) provided by a clip-like structure referred to herein as a 'clip' that is positioned electrically in parallel to the conventional single FGC path, where the respective FGC paths each have a reduced width curved head portion over, but not in electrical contact with, the Hall-effect element on the Hall-effect IC die, for providing a magnetic field oriented normal to the Hall-effect element. The curved head of the clip can be located above or below the Hall-effect IC die as long as the head overlaps the Hall-effect element. The "primary" current path for the Hall-effect sensor device can be either the conventional current path or the current path provided by the clip, depending on how thick the clip is relative to the metal thickness of the conventional FGC path. Accordingly, if the metal of the clip is thicker than the metal in the conventional FGC path, the current path provided by the clip becomes the "primary" FGC path as it during device operation would provide >50% of the FGC for the Hall-effect sensor device.

The additional current path(s) have been found to significantly enhance the performance of disclosed packaged Hall-effect sensor devices. One additional electrically parallel current path added to the conventional FGC path having the same dimensions and formed form from the same material (e.g., copper) can reduce the current level in half in the respective FGC paths as compared to a conventional single FGC path. This FGC splitting feature improves the JH for the packaged Hall-effect sensor device. The ability to support at least twice the original maximum FGC improves the effective magnetic field strength applied to the Hall-effect element, and thus the current measurement sensitivity of the packaged Hall-effect sensor device.

Optionally fusing the leads of the leadframe on the FGC side of the packaged Hall-effect sensor device further reduces the DC resistance, which lowers the power dissipation for a fixed operating current level. In addition, by optionally reducing the length of the head and tuning the head's configuration (e.g., introducing a 30 to 60 degree chamfer), the packaged Hall-effect sensor device has a greater ability to spread the charge concentration.

Disclosed aspects include a Hall-effect sensor package that includes an IC die including a Hall-effect element and signal processing circuitry, and a leadframe including leads on a first side providing a first FGC path including ≥1 first FGC input pin coupled by a reduced width curved first head over or under the Hall-effect sensor element to ≥1 first FGC output pin, and second leads on a second side of the package. At least some of the leads on the second side are attached to bond pads on the IC die including to the output of the Hall-effect element. A clip is attached at one end to the first FGC input pin and at another end to a location on the first FGC output pin. The clip has a reduced width second curved head in between that is over or under the Hall-effect sensor element opposite the first head for providing a parallel current path with respect to the first FGC path.

BRIEF DESCRIPTION OF THE DRAWINGS

Reference will now be made to the accompanying drawings, which are not necessarily drawn to scale, wherein:

FIG. 1B is a side view of the leadframe with a Hall-effect sensor IC die flip chip mounted thereon shown in FIG. 1A.

FIG. 1C is a side view of the leadframe with a Hall-effect sensor IC die flip chip mounted thereon shown in FIG. 1A that now includes a dielectric spacer between the head of the clip and the backside of the Hall-effect IC die.

FIG. 2C is a side view of the leaded packaged Hall-effect sensor device shown in FIG. 2A with a Hall-effect sensor IC die flip chip mounted thereon.

FIG. 3A to FIG. 3D show various views of an example leadless packaged Hall-effect sensor device shown as a QFN package with FIG. 3A showing a cross-sectional view of a QFN packaged Hall-effect sensor device, FIG. 3B showing a top-down view of the QFN packaged Hall-effect sensor device with the mold removed, FIG. 3C showing a 3D view of the QFN packaged Hall-effect sensor device with the mold removed, and FIG. 3D showing a bottom view of the QFN packaged Hall-effect sensor device with the mold removed.

FIG. 4B is a 3D perspective bottom view of the pre-molded Hall-effect sensor device.

DETAILED DESCRIPTION

Figure 1A:
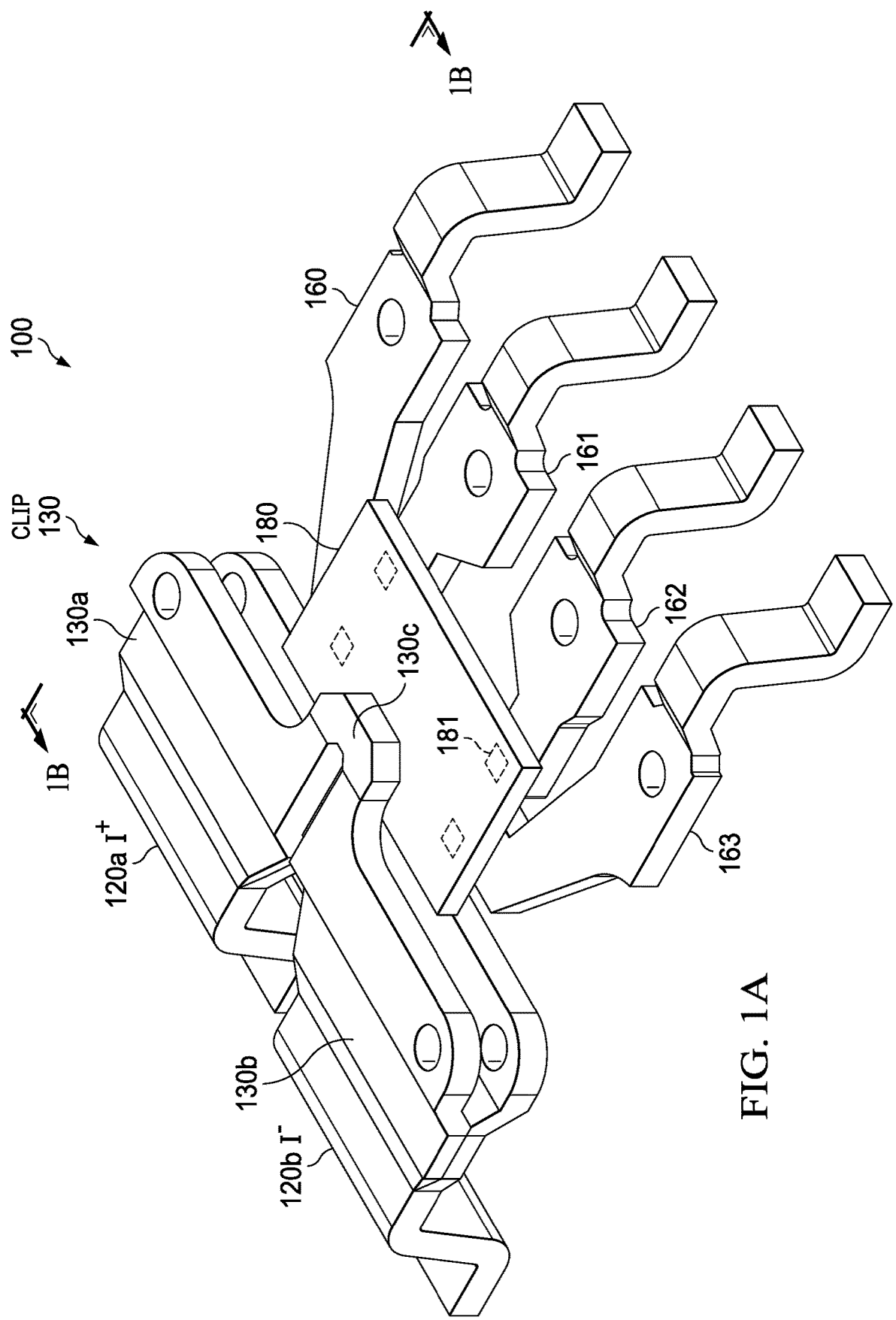
FIG. 1A is a three-dimensional (3D) perspective view of an example pre-molded leaded Hall-effect sensor device comprising a leadframe with a Hall-effect sensor IC die flip chip mounted thereon, with the leadframe including on the FGC side a clip that is electrically in parallel to the leads shown as optional fused leads.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is a 3D perspective view of an example pre-molded Hall-effect sensor device 100 comprising a leadframe with a Hall-effect IC die 180 flip chip attached having bond pads 181 thereon that is mounted onto the leads of the leadframe. The leadframe on the FGC side includes a disclosed clip 130 that comprises a metal or metal alloy such as copper that is electrically in parallel to the leads for carrying FGC with optional fused leads shown as a single fused lead 120a shown as I+ and a single fused lead 120b shown as I⁻. The clip 130 has foot portions 130a, 130b that are respectively attached to the fused leads 120a and 120b.

There is a reduced width second curved head (second head) 130c shown above the Hall-effect IC die (IC die) 180 between the foot portions of 130a, 130b. The second head 130c in FIG. 1A is shown having about a 45 degree chamfer, that is more generally a 30 to 60 degree chamfer. The chamfer is the transitional edge between two faces of an object. Similarly, the second head 130c shown in FIG. 2A, FIG. 2B (as well as the leadframe's reduced width first curved head (first head) 120c below the IC die 180 too), FIG. 3B, FIG. 3C (and the head 120c below the IC die 180 too), as well as the first head 120c in FIG. 3D, are all shown having a 30° to 60° chamfer.

The foot portions 130a, 130b can be soldered onto the fused leads 120a, 120b. The clip 130 generally provides a DC resistance that is within 10% of a DC resistance of the other FGC path. The combined FGC paths are configured to carry currents up to about 50 A to 100 A for providing a magnetic field oriented normal to the Hall-effect element on the Hall-effect IC die 180.

The second head 130c (and the first head 120c) may have a U-shape for directing FGC that a magnetic field which reaches the semiconductor Hall element. The pre-molded Hall-effect sensor device 100 has a Hall-effect element is generally a planar Hall-element (see the Hall-effect element 170 shown in FIG. 2A described below) that is sensitive to magnetic fields in the vertical (normal to the IC die's 180 top and bottom surface) direction.

"Fused leads" as used herein means only a single I+ pin shown as fused lead 120a and a single I⁻ pin shown as fused lead 120b, as shown in FIG. 1A for a first FGC path, with these pins each having a cross-sectional area dimension of more than 2 times that of conventional single leads which are located on the opposite side (output side) of the leadframe that includes pins 160-163. Although not visible in the view shown, between the fused leads 120a and 120b is a first reduced with curved head 120c (see the first curved head 120c in FIG. 2B described below). Leads (or pins) 160-163 can respectively comprise Vcc, Vout (providing the sensed Hall voltage), Vref (the reference voltage) and a ground. The respective heads both do not electrically contact the IC die 180. The second head 130c is shown in FIG. 1A being U-shaped extending over Hall-effect IC die 180 for providing a magnetic (B) field to the Hall element, and the first head 120c is also generally configured to provide the same function. As shown in FIG. 1B and FIG. 1C described below, the respective FGC paths generally also include a U-shaped (or horseshoe-shaped) head 120, 130c that has one extend under and the other extend over (but does not electrically contact) the IC die 180.

The conventional single leads 160, 161, 162 and 163 make electrical contact to the bond pads 181 on the IC die 180. In one arrangement, as noted above, the lead 160 can comprise VCC, lead 161 can comprise Vout, lead 162 can comprise Vref, and lead 163 can comprise a ground, where in operation a DC power supply applied between lead 160 and lead 163 generates a constant current flow that flows in the semiconductor Hall element, such as in a p-type Hall element. All the respective leads can be manufactured from a single piece in the leadframe strip within a frame. The IC die is then mounted onto the leadframe, followed by applying a mold compound. Lastly the package is trim-and-formed to remove the frame, and the leads bent to form the leads, such as in the gull-wing shape generally shown herein:

The Hall element on the IC die 180 includes a "Hall plate" which may be epitaxial layer on a substrate, such as a semiconductor substrate including silicon in one particular example. The epitaxial region may have low to medium level of doping, such as a relatively lightly-doped pwell region. The Hall-effect sensing element may include vias. The Hall-effect IC die 180 may include one or more dielectric passivation layers comprising a nitride, an oxide, a polymer, a polyimide, or benzocyclobutene (BCB).

FIG. 1B is a side view of the pre-molded Hall-effect sensor device 100 shown in FIG. 1A showing the leadframe holding a Hall-effect IC die 180 which may include pillars 182 that maybe solder tipped which are on the bond pads 181. The FGC shown as I is shown in FIG. 1B split in half into a first current I/2 flowing in the clip 130 and a second current I/2 flowing in the first FGC leads of the leadframe. The first head 120c of the conventional FGC path is shown under the IC die 180. Because the view provided by FIG. 1B is a side view, it appears to suggest shorting of the leads (first head 120c to 160) which is clearly not the case for the Hall-effect sensor device.

Although a flip chip arrangement with pillars 182 on the bond pads 181 for the IC die 180 is shown, other flip chip bonding arrangements may be used such as simply solder balls on the bond pads 181. Moreover the IC die 180 may be assembled top side up with wirebonds or another connection technology to make the connections between the bond pads 181 and the leads/pins of the leadframe.

FIG. 1C is a side view of the leadframe with a Hall-effect sensor IC die 180 flip chip mounted thereon shown in FIG. 1A, that now includes an additional dielectric spacer 168 between the second head 130c and the backside of the Hall-effect IC die 180. The dielectric spacer 168 helps prevent unwanted electrical contact between the second head 130c and the IC die 180. The dielectric spacer 168 for a flip chip arrangement is generally deposited as a uniformly thick layer on the entire backside of the Hall-effect IC die 180 on the wafer having a plurality of such IC die before the wafer is singulated into Hall-effect IC die 180. There are a variety of options to deposit the dielectric spacer 168.

For example, a Die Attach Film (DAF) is one example of a dielectric layer that can be uniformly formed across a backside of a wafer having a plurality of Hall-effect IC die 180. The dielectric spacer 168 helps the clip manufacturing tolerances during clip attachment to the leadframe. In one particular arrangement, the dielectric spacer 168 can comprise a b-stage adhesive material such as a DAF, or an adhesive applied dielectric film. A typical thickness range for the dielectric spacer 168 can be 15 µm to 60 µm, such as one particular arrangement being about 30 µm thick.

Figure 2A:
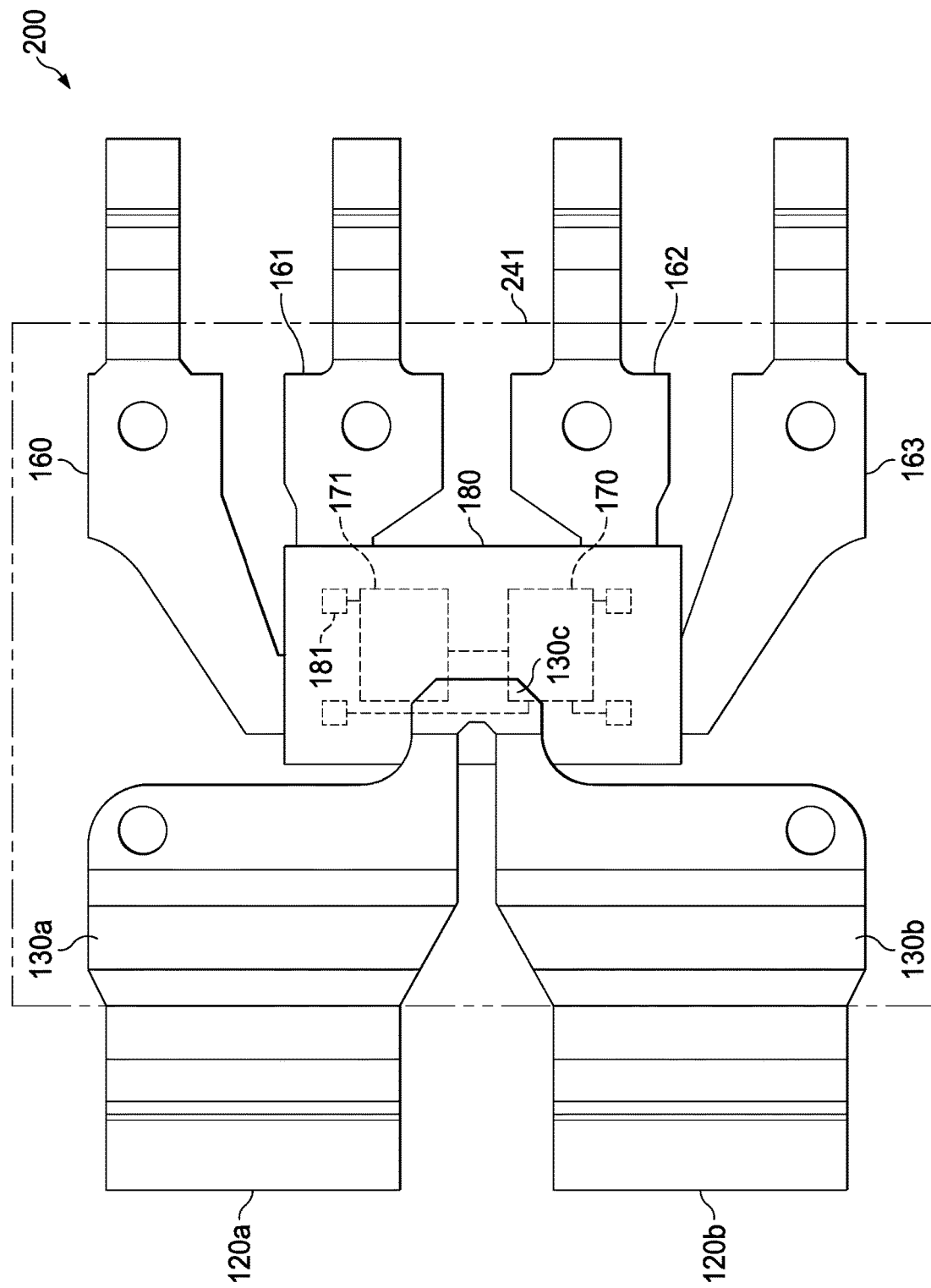
FIG. 2A shows a top see-through view of an example leadframe for a leaded packaged Hall-effect sensor device comprising a leadframe with a Hall-effect sensor IC die flip chip mounted thereon shown in FIG. 1A.
Figure 2B:
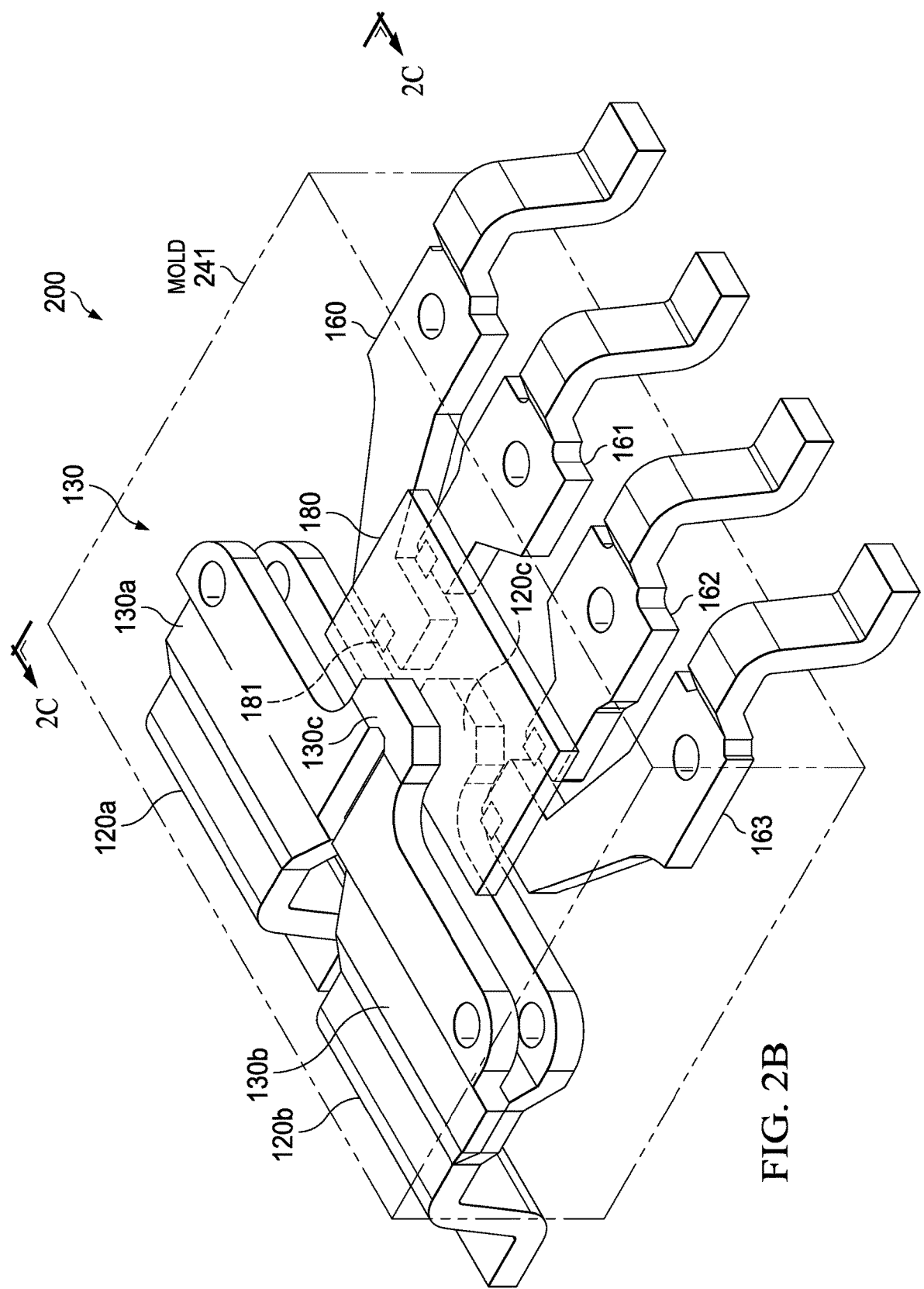
FIG. 2B is a 3D see-through view of the leaded packaged Hall-effect sensor device shown in FIG. 2A.

FIG. 2A shows a top see-through view of an example leadframe for a packaged Hall-effect sensor device 200 comprising a leadframe with an IC die 180 having a Hall-effect element 170 flip chip mounted thereon based on the pre-molded Hall-effect sensor device 100 shown in FIG. 1A. There is signal processing circuitry 171 shown coupled to an output of the Hall-effect element 170, where the signal processing circuitry 171 generally includes at least one amplifier. Mold compound is shown as 241. The packaged Hall-effect sensor device 200 includes a clip 130 as described above is on the FGC side. FIG. 2B is a 3D view of the packaged Hall-effect sensor 200 shown in FIG. 2A that shows the leadframe's first head 120c. FIG. 2C is a side view of the leaded packaged Hall-effect sensor device 200 shown in FIG. 2A with the IC die 180 flip chip mounted thereon.

Figure 3B:
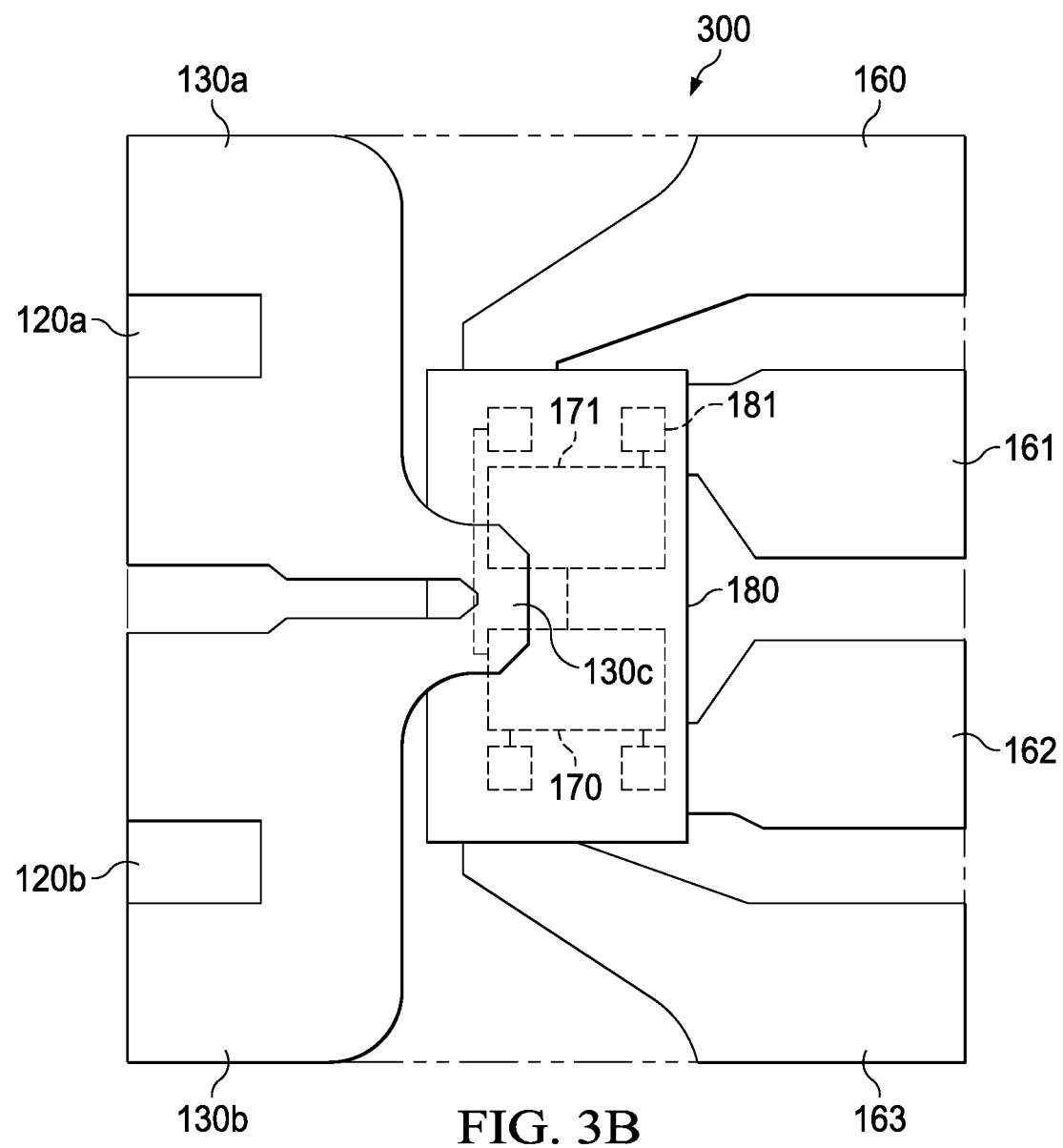
Figure 3C:
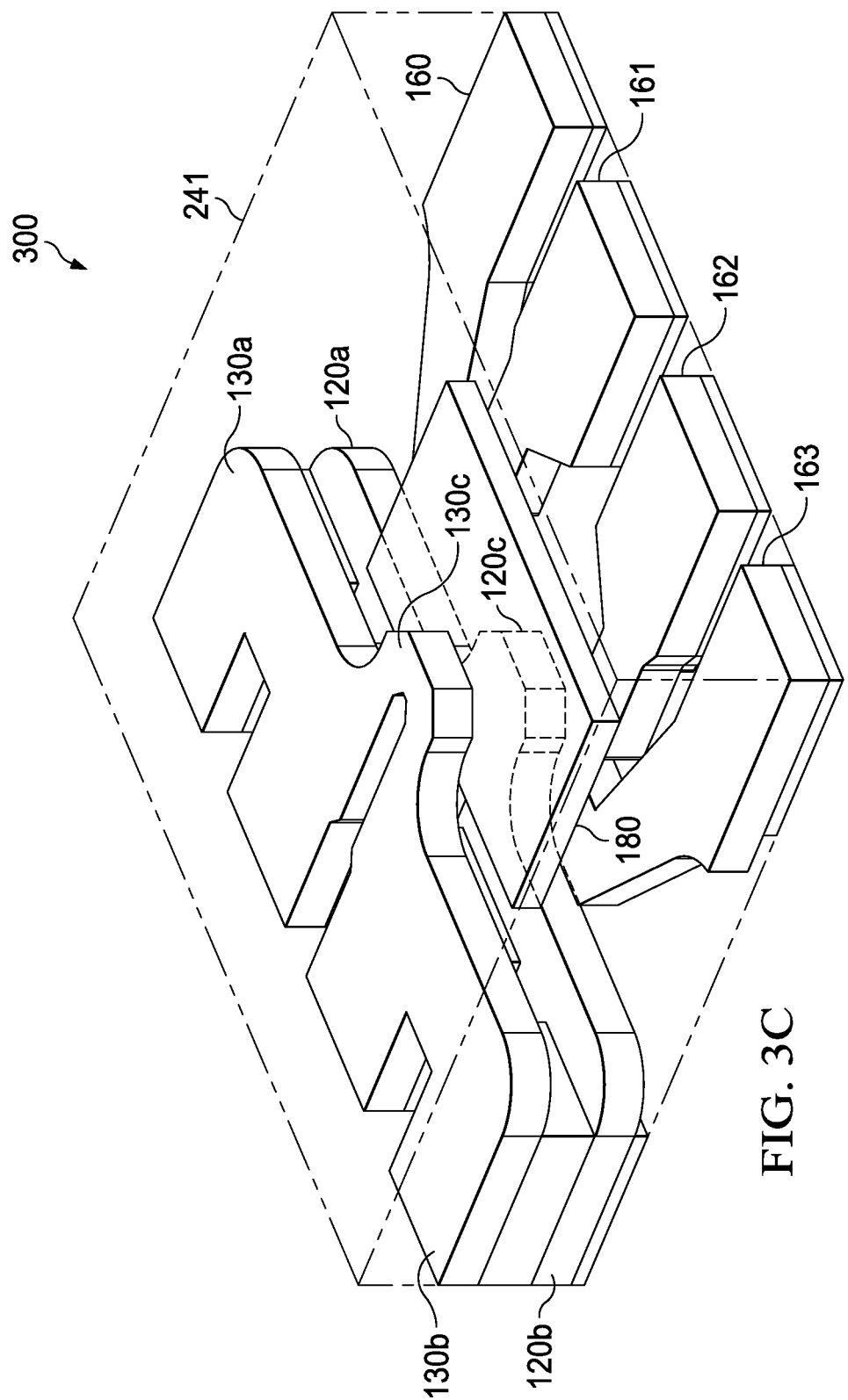
Figure 3D:
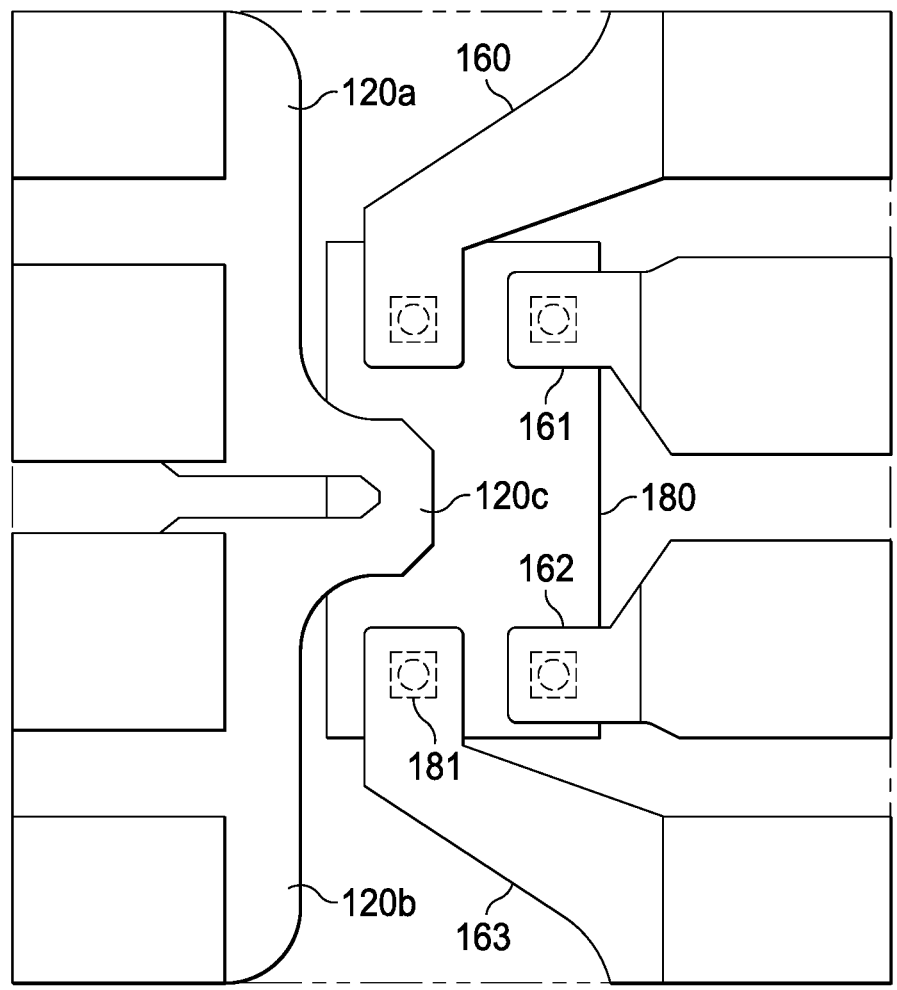

FIG. 3A to FIG. 3D show various views of an example leadless packaged Hall-effect sensor device shown as a QFN Hall-effect sensor device 300, with FIG. 3A showing a cross-sectional view of a QFN packaged Hall-effect sensor device 300. FIG. 3A being a side view, although being apparently indicated the Hall-effect IC die 180 is not electrically contacting the first head 120c. FIG. 3B is showing a top-down view of the QFN packaged Hall-effect sensor device with the mold compound 241 removed to reveal features. Certain package dimensions are shown in FIG. 3A as A, B, C, D and E. Bond pads 181 are shown including pillars 182 thereon having solder 183 thereon as a cap.

The QFN packaged Hall-effect sensor device 300 can be assembled using what is referred to herein as a gang clip stack. For a gang clip stack, a group of clips can be etched in a single piece of metal that is commonly a copper plate that matches the pattern and size of individual unit pattern that is etched on the leadframe. Individual clips are connected together by thin copper tie bars to hold the clips in the shape of a clip frame that matches the position of the unit design on the leadframe. The collection of clips in the shape of a frame also called gang clip are overlayed on top of the leadframe, where the clip frame is similar to a copper leadframe, but is only smaller in size. This stacking of a plurality of clips on top of leadframe forms the gang clip stack.

A disclosed gang clip stack on the leadframe for placement of clips 130 achieves more accurate vertical alignment shown as E in FIG. 3A of the second head 130c of the clip 130 to the leadframe's first head 120c which as noted above may both be horseshoe shaped. Selective plating on leadframe at the clip 130 to leadframe joint may be used for self-aligning of the clip 130 to leadframe when solder 183 or like material is used for the clip 130 to leadframe joining. However as described below, a riveting approach may also be used for this joining, describe below relative to FIG. 4A.

The C dimension shown in FIG. 3A is the gap (spacing) between the clip 130 and the backside of the flipchip IC die 180. The C dimension can be 50 µm to 100 µm. One can either use a high voltage tolerant mold compound shown as mold compound 241 to provide this isolation or instead use isolation material coating described above as the dielectric spacer 168 shown in FIG. 1C on the IC die's 180 back side.

A single piece metal clip can be used to minimize the interconnect layers. The thickness dimensions shown as A and B for the leadframe and the clip 130 can be essentially the same. The Hall-effect IC die 180 bump height can be selected to enable complete mold compound 241 underfill, such as using vacuum molding to essentially eliminate voids in the mold compound 241. A single pass reflow may be used after flipchip IC die 180 placement and clip-frame shown in FIG. 3E described below.

FIG. 3B is a top-down view of the QFN packaged Hall-effect sensor device 300 shown in FIG. 3A, and FIG. 3C is a 3D view of the same. In FIG. 3C the leads 160-163 are shown along with the fused lead 120b. FIG. 3D is a bottom view of the QFN packaged Hall-effect sensor device 300 with the mold compound 241 removed to reveal certain features.

Figure 3E:
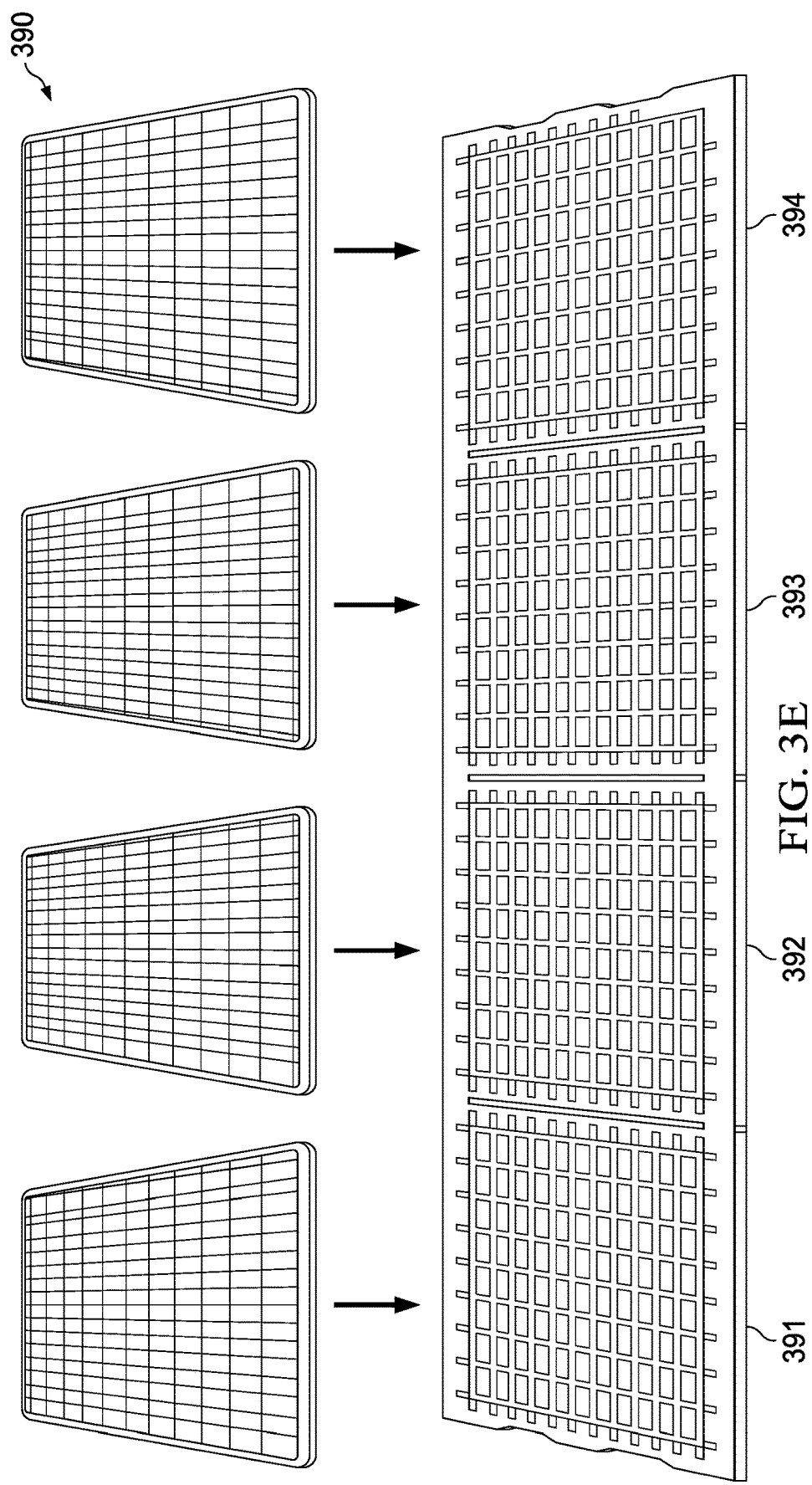
FIG. 3E depicts stacking multiple clip frames on top of multiple panels of a standard leadframe for providing more accurate placement and alignment of the clip to the leadframe after a flip chip die attach process onto the leadframe.

FIG. 3E depicts stacking multiple clip frames on top of multiple QFN leadframes of a standard QFN leadframe panel for providing more accurate placement and alignment of the clips 130 to the leadframe after the flip chip Hall-effect IC die 180 attach process onto the leadframe. As shown in FIG. 3E a gang clip frame 390 shown comprising as four clip frames, with each clip frame shown having a plurality of clips. A clip frame is a leadframe of clips, where the clip may be attached on top of the bottom leadframe, such as by solder using a soldering process. This attachment can generally be performed in a panel format. As shown in FIG. 3E, the clips in the gang clip frame 390 are stacked on top of four leadframe panels shown as 391, 392, 393 and 394 for more accurate clip placement and alignment, which follows after the IC die 180 flipchip attach process.

This disclosed gang clip frame-based placement technique is more accurate as compared to a conventional clip placement technique on the leadframe. Conventional clip placement processes use placement of single clips at specific locations that are prone to the clips not being placed accurately and also prone to movement during solder reflow. Gang clip placement generally has better placement accuracy when placed with the assistance of alignment markers on the leadframe. Placement accuracy can be further improved by implementing locking features in between the clip frame and the leadframe.

Precise alignment is achieved by several features. The X-Y dimension of the unit size on the leadframe and the clip frame can be essentially the same, and when the clip frame is overlayed on the leadframe the second head 130c of the clip 130 can be almost exactly aligned on top of the first head 120c of the leadframe. As described above, alignment marks are generally etched in the leadframe that help place the clip frame exactly on top of the leadframe panel. The optional locking features noted above can be included in between the clip frame and leadframe to help prevent movement of the clipframe during reflow.

Disclosed aspects also include a riveting approach that increases the thickness of the leadframe. Riveting provides a similar advantage as the clip solutions described above, where riveting increases the current carrying capability and heat dissipation through the device. This riveting feature provides selective leadframe thickness adjustment with rivets such that the current density can be kept constant without generating significant JH in the device.

Figure 4A:
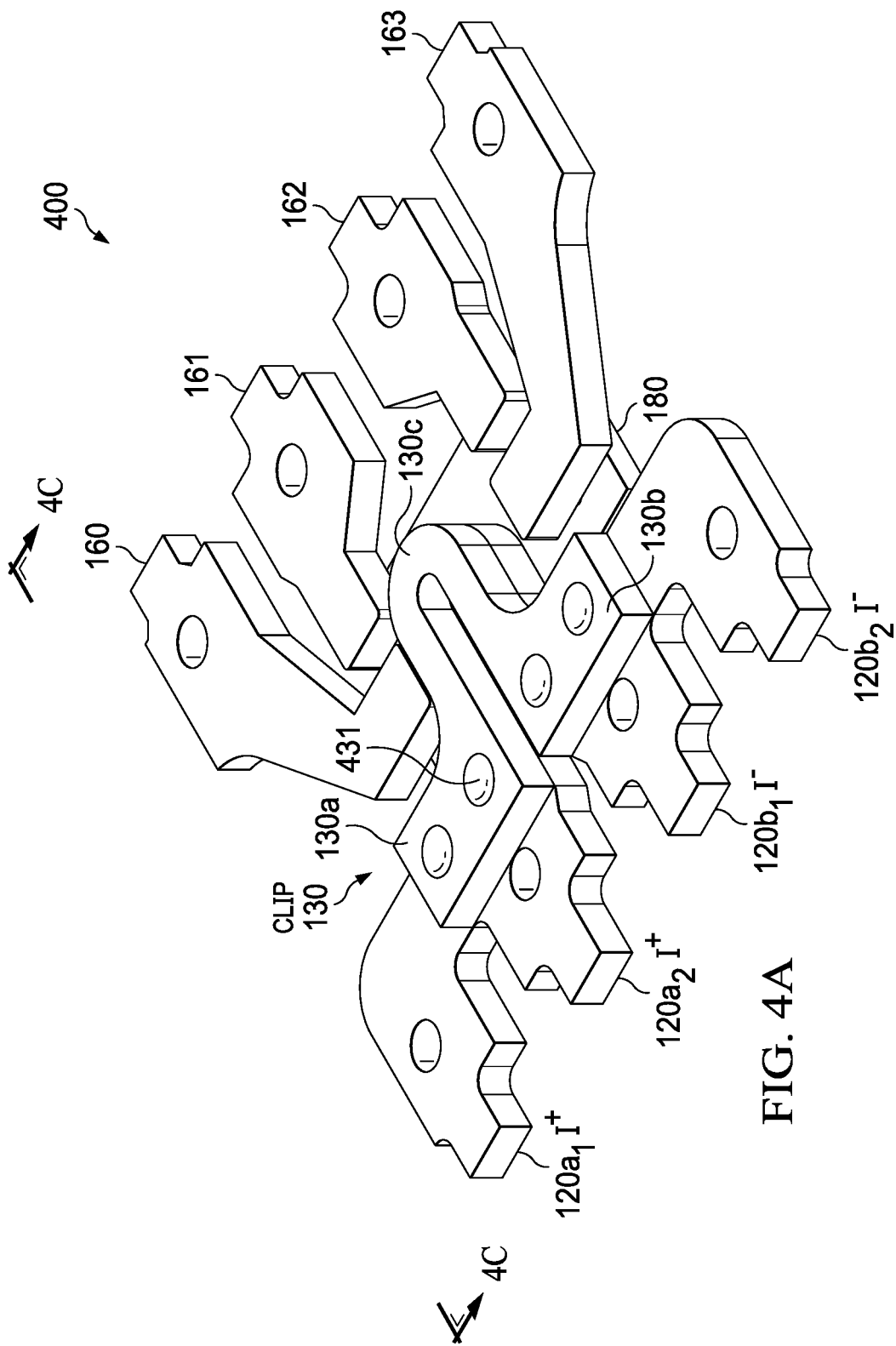
FIG. 4A is a 3D perspective top view of a pre-molded Hall-effect sensor device comprising a leadframe with a Hall-effect sensor IC die assembled top side up having a Hall-effect sensor having bond pads (not shown) that is attached to leads of a leadframe, where the clip is riveted to the leadframe.
Figures 4C, 5:
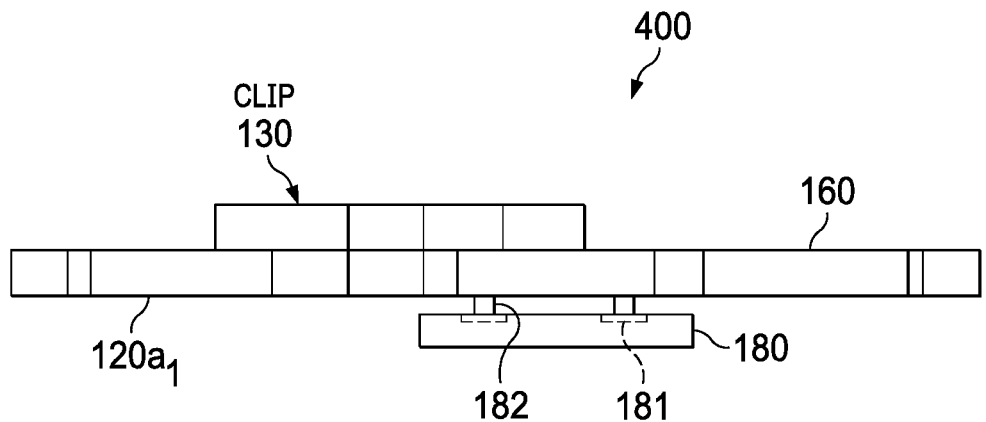
FIG. 4C is a cross sectional view of the leadframe with a Hall-effect sensor IC die shown in FIG. 4A and FIG. 4B that evidence a double (2×) leadframe thickness on the FGC side of the sensor device.
FIG. 5 is a data table showing a packaged Hall-effect device's figure of merit (FOM) performance comparison between a known Hall-effect sensor device package that lacks a disclosed clip and disclosed fused leads and a disclosed packaged Hall-effect sensor device that generally follows the configuration of the known Hall-effect sensor device but further comprises both a disclosed clip and disclosed fused leads.

FIG. 4A is a 3D perspective top view of a pre-molded Hall-effect sensor device 400 comprising a leadframe with a IC die 180 assembled top side up having a Hall-effect sensor having bond pads 181 generally with pillars 182 thereon (bond pads/pillars not shown) that is attached top side up to a bottom side of the leads 160-163 of a leadframe, typically by a solder connection where the clip 130 is riveted by rivets 431 to the leadframe. On the FGC side there are 4 lead terminals shown, $120a_1$ I+, $120a_2$ I⁻$120b_1$, and $120b_2$ I⁻. FIG. 4B is a 3D perspective bottom view of the pre-molded Hall-effect sensor device 400. FIG. 4C is a cross sectional view of the leadframe with a Hall-effect sensor IC die shown in FIG. 4A and FIG. 4B that evidence a double (2×) leadframe thickness on the FGC side of the device, such as being 16 mils thick.

EXAMPLES

Disclosed aspects are further illustrated by the following specific Examples, which should not be construed as limiting the scope or content of this Disclosure in any way.

FIG. 5 is a data table showing a packaged Hall-effect sensor device FOM performance comparison between a known Hall-effect sensor device package that lacks a disclosed clip and disclosed fuse leads on the FGC side and disclosed a Hall-effect sensor device package that follows the known Hall-effect sensor device but further comprises both a disclosed clip and disclosed fused leads. The DC resistance can be seen to decrease about 65%. The JH had been reduced about 79%. The magnetic field strength (in mT) increased about 60% at 50 mA or more of FGC. Although the stress volume which is defined as the volume occupied with a given electric field value is shown increased by about 20% due to the addition of a disclosed clip, the stress volume can be decreased, such as by increasing the dielectric thickness.

Disclosed aspects can be integrated into a variety of assembly flows to form a variety of different Hall-effect devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those having ordinary skill in the art to which this Disclosure relates will appreciate that many variations of disclosed aspects are possible within the scope of the claimed invention, and further additions, deletions, substitutions and modifications may be made to the above-described aspects. For example, as known, there are different types of Hall-effect elements, for example, the planar Hall element generally described herein, a vertical Hall element, and a Circular Vertical Hall (CVH) element. A planar Hall element is sensitive to magnetic fields in the vertical (normal to the Hall-effect IC die's surface) direction. This is the direction of magnetic field produced by a current horseshoe as shown above for the second head 130c of the clip I⁺ to I⁻ FGC path of the current leads. Vertical hall elements are constructed to sense fields parallel to the surface of the chip, and different current conductor would be used to produce those fields.

The invention claimed is:

1. A Hall-effect sensor package, comprising:
an integrated circuit (IC) die including at least one Hall-effect sensor element and signal processing circuitry including at least an amplifier coupled to an output node of the Hall-effect element;
a leadframe including:
a plurality of leads including a first plurality of leads on a first side of the package providing a first field generating current (FGC) path including at least one first FGC input pin coupled by a reduced width first curved head over or under the Hall-effect sensor element to at least one first FGC output pin and a second plurality of leads on a second side of the package that is opposite to the first side;
wherein at least some of the plurality of leads on the second side are attached to bond pads on the IC die including to an output of the Hall-effect sensor element, and
a clip attached at one end to a location on the first FGC input pin and at another end to a location on the first FGC output pin with a reduced width second curved head in between that is over or under the Hall-effect sensor element opposite the first curved head for providing a parallel FGC path with respect to the first FGC path.

2. The Hall-effect sensor package of claim 1, wherein the clip provides a direct current (DC) resistance that is within 10% of a DC resistance of the first FGC path.

3. The Hall-effect sensor package of claim 1, wherein the first FGC path consists of only the first FGC input pin coupled to only the first FGC output pin.

4. The Hall-effect sensor package of claim 1, wherein at least the second curved head has a 30 to 60 degree chamfer.

5. The Hall-effect sensor package of claim 1, wherein the IC die is flip chip attached in a chip-on lead arrangement to the plurality of leads on the second side.

6. The Hall-effect sensor package of claim 5, further comprising pillars on the bond pads attached to the plurality of leads on the second side.

7. The Hall-effect sensor package of claim 5, further comprising a dielectric spacer between the first curved head and a back side of the IC die for preventing electrical contact between the first curved head and the back side of the IC die.

8. The Hall-effect sensor package of claim 1, wherein the dielectric spacer comprises a dielectric polymer material.

9. The Hall-effect sensor package of claim 1, wherein the leadframe comprises a leadless leadframe.

10. The Hall-effect sensor package of claim 1, wherein the clip is attached to the first FGC input pin and to the first FGC output pin by rivets.

11. A Hall-effect sensor package, comprising:
an integrated circuit (IC) die including at least one Hall-effect sensor element and signal processing circuitry including at least an amplifier coupled to an output node of the Hall-effect element;
a plurality of leads including a first plurality of leads on a first side of the package providing a first field generating current (FGC) path including at least one first FGC input pin coupled by a reduced width first curved head over or under the Hall-effect sensor element to at least one first FGC output pin and a second plurality of leads on a second side of the package that is opposite to the first side;
wherein at least some of the plurality of leads on the second side are attached to bond pads on the IC die including to an output of the Hall-effect sensor element; and
a clip attached at one end to a location on the first FGC input pin and at another end to a location on the first FGC output pin with a reduced width second curved head in between that is over or under the Hall-effect sensor element opposite the first curved head for providing a parallel FGC path with respect to the first FGC path.

12. The Hall-effect sensor package of claim 11, wherein the clip provides a direct current (DC) resistance that is within 10% of a DC resistance of the first FGC path.

13. The Hall-effect sensor package of claim 11, wherein the first FGC path consists of only the first FGC input pin coupled to only the first FGC output pin.

14. The Hall-effect sensor package of claim 11, wherein at least the second curved head has a 30 to 60 degree chamfer.

15. The Hall-effect sensor package of claim 11, wherein the IC die is flip chip attached in a chip-on lead arrangement to the plurality of leads on the second side.

16. The Hall-effect sensor package of claim 15, further comprising pillars on the bond pads attached to the plurality of leads on the second side.

17. The Hall-effect sensor package of claim 15, further comprising a dielectric spacer between the first curved head and a back side of the IC die for preventing electrical contact between the first curved head and the back side of the IC die.

18. The Hall-effect sensor package of claim 11, wherein the dielectric spacer comprises a dielectric polymer material.

19. The Hall-effect sensor package of claim 11, wherein the leadframe comprises a leadless leadframe.

20. The Hall-effect sensor package of claim 11, wherein the clip is attached to the first FGC input pin and to the first FGC output pin by rivets.

21. A Hall-effect sensor package, comprising:
a leadframe including:
a plurality of leads including a first plurality of leads on a first side of the package providing a first field generating current (FGC) path including at least one first FGC input pin coupled by a reduced width first curved head over or under a Hall-effect sensor element to at least one first FGC output pin and a second plurality of leads on a second side of the package that is opposite to the first side;
wherein at least some of the plurality of leads on the second side are attached to bond pads on an IC die including to an output of the Hall-effect sensor element, and
a clip attached at one end to a location on the first FGC input pin and at another end to a location on the first FGC output pin with a reduced width second curved head in between that is over or under the Hall-effect sensor element opposite the first curved head for providing a parallel FGC path with respect to the first FGC path.

* * * * *